(12) United States Patent
Karg et al.

(10) Patent No.: US 7,282,430 B2
(45) Date of Patent: Oct. 16, 2007

(54) MELT-BASED PATTERNING FOR ELECTRONIC DEVICES

(75) Inventors: Siegfried F. Karg, Adliswil (CH); Heike E. Riel, Rueschlikon (CH); Walter H. Riess, Thalwil (CH)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 10/852,714

(22) Filed: May 24, 2004

(65) Prior Publication Data
US 2005/0009231 A1  Jan. 13, 2005

(30) Foreign Application Priority Data
Jun. 3, 2003  (EP)  ................... 03405403
Aug. 29, 2003  (EP)  ................... 03019744

(51) Int. Cl.
*H01L 21/00*  (2006.01)
(52) U.S. Cl. .................. 438/609; 438/585; 438/496; 438/328; 427/58; 257/E25.032
(58) Field of Classification Search ...... 438/FOR. 157, 438/FOR. 287, 328, 496, 609, 585; 427/58; 257/E25.032
See application file for complete search history.

(56) References Cited

U.S. PATENT DOCUMENTS

| | | | | |
|---|---|---|---|---|
| 4,542,390 A | * | 9/1985 | Bruning et al. | 347/35 |
| 4,575,738 A | * | 3/1986 | Sheufelt et al. | 347/94 |
| 4,598,303 A | * | 7/1986 | Peekema et al. | 347/71 |
| 4,613,875 A | * | 9/1986 | Le et al. | 347/21 |
| 4,998,120 A | * | 3/1991 | Koto et al. | 347/70 |
| 5,010,355 A | * | 4/1991 | Hawkins et al. | 347/64 |
| 5,105,209 A | * | 4/1992 | Koto et al. | 347/70 |
| 5,113,204 A | * | 5/1992 | Miyazawa et al. | 347/68 |
| 5,124,716 A | * | 6/1992 | Roy et al. | 347/11 |
| 5,750,604 A | * | 5/1998 | Banning et al. | 524/187 |
| 6,013,982 A | * | 1/2000 | Thompson et al. | 313/506 |
| 6,087,196 A | * | 7/2000 | Sturm et al. | 438/29 |
| 6,114,187 A | * | 9/2000 | Hayes | 438/106 |
| 6,471,115 B1 | * | 10/2002 | Ijuin et al. | 228/180.22 |
| 6,555,840 B1 | * | 4/2003 | Hudson et al. | 257/40 |
| 6,774,392 B2 | * | 8/2004 | Humbs et al. | 257/40 |

(Continued)

OTHER PUBLICATIONS

Hue P Le, Progress and Trends in Ink-Jet Printing Technology, Nov. 3, 1997, Journal of Imaging Science and Technology, vol. 42, No. 1.*

(Continued)

*Primary Examiner*—W. David Coleman
*Assistant Examiner*—Nicholas J. Tobergte
(74) *Attorney, Agent, or Firm*—Louis P. Herzberg

(57) ABSTRACT

The present invention provides methods and apparatus for melt-based patterning for electronic devices. It employs and provides processes and apparatus for fabricating an electronic device having a pattern formed on a surface by a deposition material. Further, the invention a process for fabricating semiconductors, organic light-emitting devices (OLEDs), field-effect transistors, and in particular high-resolution patterning for RGB displays. A process for fabricating an organic electronic device includes the steps of heating and applying a pressure to the deposition material to form a melt, and depositing the melted deposition material on the surface with a phase-change printing technique or a spray technique. The melted deposition material solidifies on the surface.

20 Claims, 3 Drawing Sheets

U.S. PATENT DOCUMENTS

| | | |
|---|---|---|
| 6,841,270 B2 * | 1/2005 | Li et al. .................... 428/690 |
| 6,891,326 B2 * | 5/2005 | Lu .............................. 313/504 |
| 6,911,671 B2 * | 6/2005 | Marcus et al. ................ 257/79 |
| 6,965,125 B2 * | 11/2005 | Sakurai et al. ................ 257/79 |
| 6,982,179 B2 * | 1/2006 | Kwong et al. ................ 438/22 |
| 7,067,170 B2 * | 6/2006 | Marcus et al. ................ 427/66 |
| 2002/0083858 A1 | 7/2002 | MacDiarmid et al. |
| 2002/0097308 A1 * | 7/2002 | Oyanagi ..................... 347/100 |
| 2003/0035917 A1 * | 2/2003 | Hyman ....................... 428/67 |
| 2003/0047729 A1 * | 3/2003 | Hirai et al. .................... 257/40 |
| 2003/0087026 A1 * | 5/2003 | Dijksman et al. ............. 427/58 |
| 2003/0175411 A1 * | 9/2003 | Kodas et al. ................. 427/58 |
| 2004/0013019 A1 * | 1/2004 | Otose ......................... 365/202 |
| 2004/0062856 A1 * | 4/2004 | Marcus et al. ................ 427/66 |
| 2004/0149353 A1 * | 8/2004 | Hill .............................. 148/33 |
| 2004/0209114 A1 * | 10/2004 | Li et al. ..................... 428/690 |
| 2004/0222413 A1 * | 11/2004 | Hsu et al. ..................... 257/40 |
| 2004/0247933 A1 * | 12/2004 | Thoms ....................... 428/690 |
| 2006/0268195 A1 * | 11/2006 | Heeks et al. .................. 349/69 |

OTHER PUBLICATIONS http://aic.standford.edu/sg/emg/juergens/ID46.htm.*
Semiconductor Magazine (vol. 3, No. 4, Apr. 1, 2004).

* cited by examiner

MELT-BASED PATTERNING FOR ELECTRONIC DEVICES

TECHNICAL FIELD

The present invention is related to a process for fabricating an electronic device having a pattern formed on a surface by a deposition material. Further, the invention is related to a process for fabricating a field-effect transistor and in particular to high-resolution patterning for RGB displays.

BACKGROUND OF THE INVENTION

Organic electronic devices and in particular organic light-emitting devices (OLEDs) are commonly manufactured as a sequence of layers deposited on top of each other such as a first electrode on a supporting substrate, several organic and inorganic layers, and a second electrode. So far, OLED technology is lacking a high-resolution patterning method for RGB displays for small molecules. The deposition technologies developed for small molecules so far show limitations for mass production of large-sized displays.

Conventionally, vacuum evaporation is employed as the physical vapor deposition method in forming the organic layers. A common method for patterning of the organic layers e.g. for red, green, and blue emitting sub-pixels in a full-color display, is the shadow mask technique. However, this technique is limited in size, resolution of the panel, and the individual fill-factor of the pixel. For example, shadow mask technology becomes extremely complicated in particular for small feature sizes. The material deposition during the process requires regular mask cleaning steps which delay the manufacturing. Thermal expansion of the mask during the deposition limits the precision and aperture ratio. Moreover, repeatedly necessary mask alignment is time consuming and reduces yield.

A method used for patterning polymer light-emitting devices is ink-jet printing of dissolved polymers as described in U.S. Pat. No. 6,087,196. This method of dispensing a liquid solution is not suitable for multi-layer OLEDs based on small molecules because previously deposited layers are re-dissolved and intermixed by the sequential deposition of multiple layers from different solutions. When small molecules are heated some of the small molecules sublime directly, while others first melt and then evaporate. Therefore a new way of depositing such molecules is needed. It follows that there is still a need in the art for improved patterning of structures for the fabrication of semiconductor devices, sensors, biochips, and displays using organic and/or inorganic active or biological layers.

SUMMARY AND ADVANTAGES OF THE INVENTION

An aspect of the present invention is to provide methods and apparatus for the fabrication of semiconductor devices, circuits, sensors, biological patterns, biochips, and monochrome and/or color displays using organic and/or inorganic active or biological layers. It involves the deposition of molecules, oligomers or nanoparticles by a phase-change printing or spray technique and the fabrication of organic light-emitting devices (OLEDs), color displays and other semiconductor devices.

In an example embodiment of the present invention, there is provided a process for fabricating an electronic device having a pattern formed on a surface by a deposition material. The process comprises the steps of heating and applying a pressure to the deposition material to form a melt, and depositing the melted deposition material on the surface with a phase-change printing technique or a spray technique. Thereby the melted deposition material solidifies on the surface, i.e. when it reaches the surface.

In an other example embodiment of the present invention, a field-effect transistor, also referred to as a thin-film field-effect transistor, is made by a process comprising the steps of forming source and drain contacts on a substrate; heating and applying a pressure to a deposition material to form a melt, the deposition material comprising an organic semiconducting material; depositing the melted deposition material onto the substrate with the source and drain contacts by one of a phase-change printing technique, and a spray technique, wherein the melted deposition material solidifies on the substrate and forms an organic semiconducting layer; forming an insulating layer on the organic semiconducting layer; and forming a gate contact on the insulating layer.

It is also possible to form the source, drain, and gate contacts as well as the insulating layer by the phase-change printing or spray technique. This has the advantage that the whole device can be fabricated by the disclosed process.

DESCRIPTION OF THE DRAWINGS

Embodiments of the invention are described in detail below, by way of example only, with reference to the following schematic drawings, in which.

Figure 1:
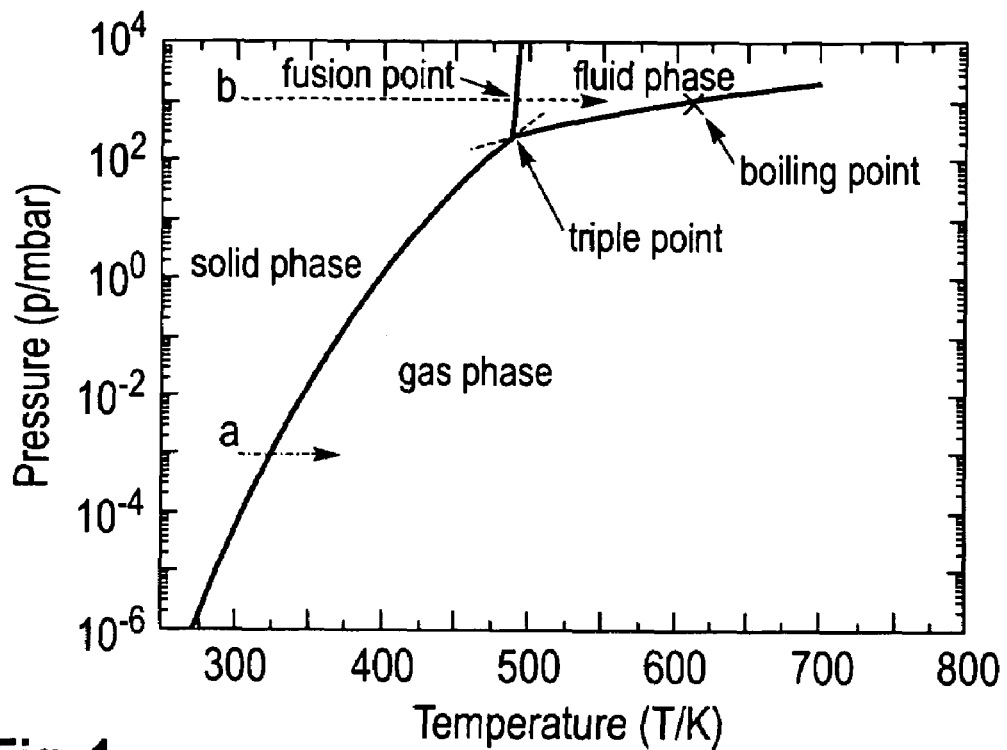
FIG. 1 illustrates a phase diagram of a one-component system.

The drawings are provided for illustrative purpose only and do not necessarily represent examples of the present invention to scale.

DETAILED DESCRIPTION OF THE INVENTION

The present invention enables methods and apparatus for the fabrication of semiconductor devices, circuits, sensors, biological patterns, biochips, and monochrome and/or color displays using organic and/or inorganic active or biological layers. It includes the deposition of molecules, oligomers or nanoparticles by a phase-change printing or spray technique and the fabrication of organic light-emitting devices (OLEDs), color displays and other semiconductor devices.

In accordance with the present invention, there is provided an example of a process for fabricating an electronic device having a pattern formed on a surface by a deposition material. The process comprises the steps of heating and applying a pressure to the deposition material to form a melt, and depositing the melted deposition material on the surface with a phase-change printing technique or a spray technique. Thereby the melted deposition material solidifies on the surface, i.e. when it reaches the surface.

In general, the present invention relates to a way of high-resolution patterning of layers, for example with organic molecules, by a phase-change printing technique, also referred to as wax or fusion printing technique, for the use in semiconductor devices, sensors, or color displays. Also a spray technique utilizing a gas can be applied. Prior to deposition, the deposition material or a part thereof is heated to the melting temperature in a pressure chamber utilizing the p-V (T) diagram and deposited onto a substrate or surface, e.g. a thin film transistor array for a full-color display. The deposition of the melted deposition material can be performed by a thermal phase-change printing technique or a spray technique. The material solidifies immediately when it hits the substrate. The deposition can be repeated to cast multiple layers on top of each other. The steps of the process can be repeated to deposit multiple layers, i.e. more than three layers can be formed easily. In a further example, the multiple layers can be formed by depositing different deposition materials. The process allows a controlled deposition of the materials and tailoring of the characteristics, e.g. by substrate heating/cooling, deposition in hot environment (gas), changing pressure etc. Further, the process is also ideally suited for doped systems (mixing of liquids).

As indicated, the heating and applying of pressure can be performed in a pressure chamber exploiting the pressure (P)/temperature (T) phase diagram according to the Clausius-Clapeyron equation. This allows a controlled melting of the deposition material. By using the pressure chamber, basically every material, can be used for phase-change or thermal printing and spray technique. There is no need for a mask, the pattern is determined by the printing process, i.e. droplets emerging as a jet from nozzles towards the surface or substrate. The nozzles can be piezo-controlled and moved over the substrate. It is also possible to move the substrate while the nozzles are fixed. Additionally, even higher precision can be achieved by using an integrated shadow mask, e.g. a photo resist, which can be used to determine the patterns. Ultrahigh precision can thus be achieved.

The deposition material can be selected to comprise one of an organic material, an OLED material, biological molecules, nanoparticles, and a combination thereof. Further, the deposition material can be a composition in form of a powder. This has the advantage that it can be easily mixed with further components. Moreover, the deposition material can be provided as a pellet. This allows a comfortable way of packaging, storing, handling, and processing.

In another embodiment of the present invention, a field-effect transistor, also referred to as a thin-film field-effect transistor, is made by a process comprising the steps of forming source and drain contacts on a substrate; heating and applying a pressure to a deposition material to form a melt, the deposition material comprising an organic semiconducting material; depositing the melted deposition material onto the substrate with the source and drain contacts by one of a phase-change printing technique, and a spray technique, wherein the melted deposition material solidifies on the substrate and forms an organic semiconducting layer; forming an insulating layer on the organic semiconducting layer; and forming a gate contact on the insulating layer. It is also possible to form the source, drain, and/or gate contacts as well as the insulating layer by the phase-change printing or spray technique. This has the advantage that the whole device can be fabricated by the presently disclosed process.

Although the present invention is applicable in a broad variety of applications it will be described with the focus put on an application to an organic electroluminescent device, i.e. an organic light-emitting device (OLED) and a field-effect transistor, but first general issues and the process is addressed. Within the description, the same reference numbers are used to denote the same parts or the like.

FIG. 1 illustrates a phase diagram of a one-component system. In a conventional physical vapor deposition process the solid material is usually heated at a reduced pressure to a temperature above the respective sublimation temperature to vaporize the material (arrow labeled with a). When the solid material is heated at a pressure above the triple point then the solid changes into liquid phase at the respective fusion point (arrow labeled with b). In the depicted example for Anthracene the triple point temperature is 489K, the fusion temperature at normal pressure is 490K. The phase diagram of two and more-component systems is by far more complex. The principle of changing from solid to liquid phase is still applicable.

Figure 2A:
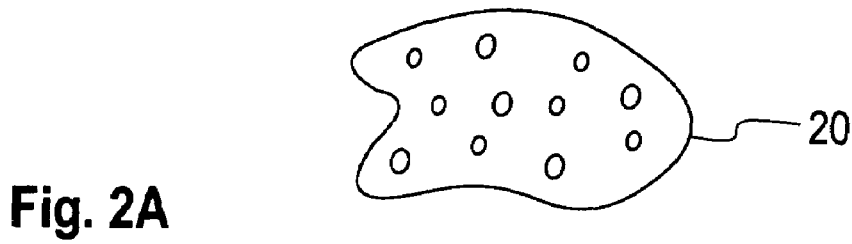
FIGS. 2a-c illustrate steps for forming a pattern on a surface by deposition of a deposition material using a pressure chamber in accordance with the present invention.
Figure 2B:
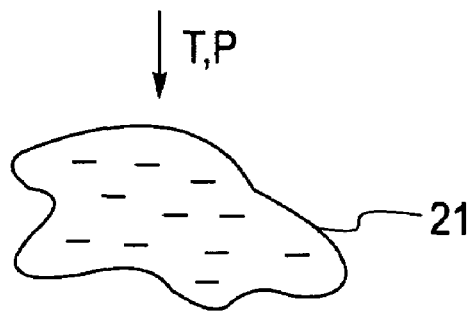
Figure 2C:
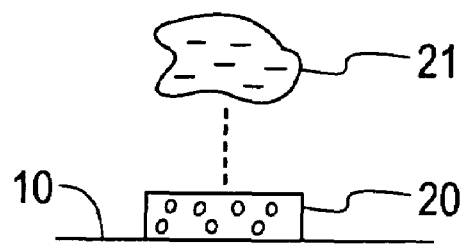

FIGS. 2a-c illustrate steps for forming a pattern on a surface 10 by deposition of a deposition material 20. For the sake of simplicity, the figure is simplified to a droplet. Two or more thereof are contemplated to form a pattern and multiple a layer. FIG. 2a illustrates the deposition material 20. As indicated by the arrow and the letters T, P, the deposition material 20 is heated and a pressure is applied within a pressure chamber (not shown) to form a melt. The melted deposition material 21 is illustrated in FIG. 2b. Then, as indicated in FIG. 2c, the melted deposition material 21 is deposited on the surface 10 by a phase-change printing or spraying technique. Thereby the melted deposition material 21 solidifies instantaneously when it reaches the surface 10. The melted deposition material 21 can be deposited via piezo elements (not shown). Finally, as indicated in FIG. 2c, the solidified deposition material 20 remains on the surface 10. In order to deposit multiple or various layers of the deposition material 20 or different deposition materials, the process steps are repeated. The deposition material 20 can also be mixed with other materials or may comprise of two or more components. In the FIGS. 2a-c, the symbols "o" illustrate the components of the deposition material 20 in solid form whilst the symbols "–" illustrate the components of the deposition material 20 in melted form.

Figure 3A:
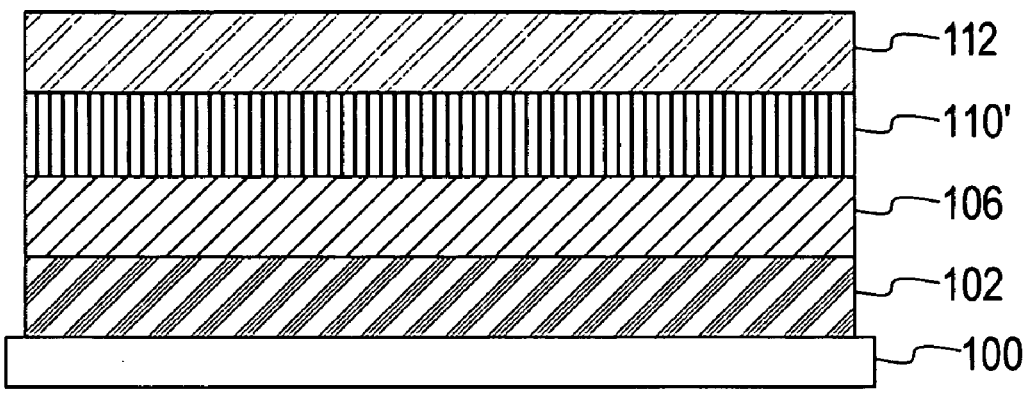
FIGS. 3a, b show schematic illustrations of a formation of organic light-emitting devices.
Figure 3B:
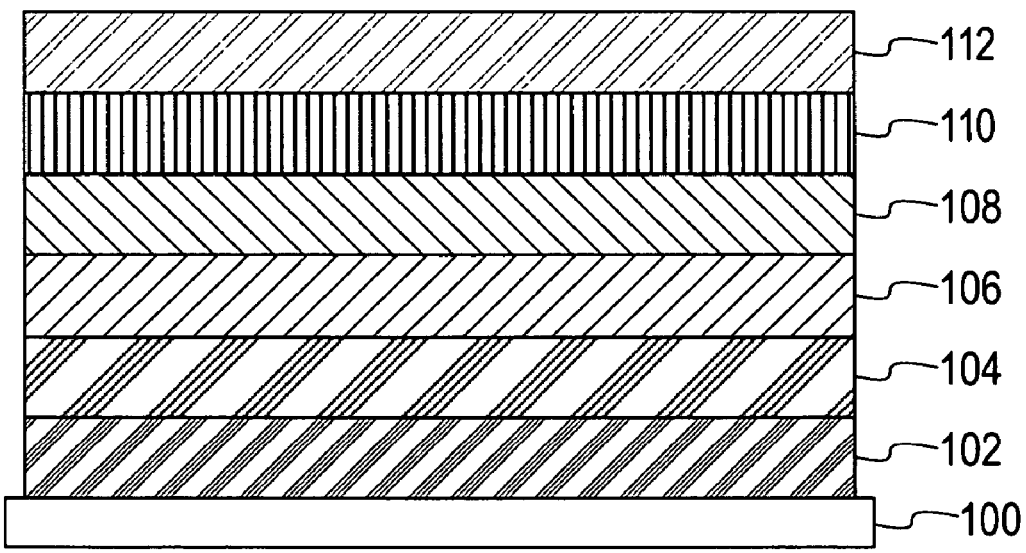
FIG. 3c shows a schematic illustration of a formation of an RGB display.
Figure 3C:
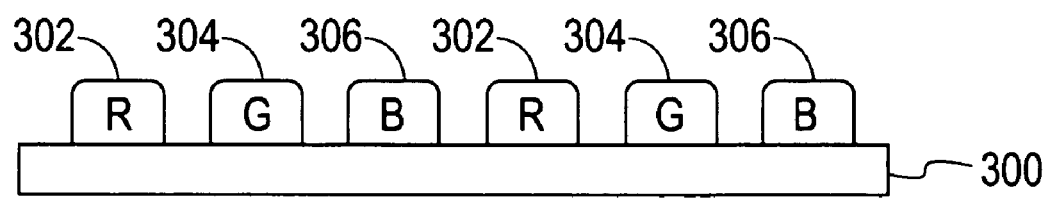

The FIGS. 3a to 3c show a schematic illustration of the formation of an organic light-emitting device (OLED). In at least some instance the OLED includes a thin layer, or layers, of suitable organic materials sandwiched between a cathode and an anode. One suitable example of the OLED is illustrated in FIG. 3a. On a suitable surface of a substrate 100, a first electrode (anode) 102 (metal, ITO, conductive polymer) is provided either by conventional methods, like PVD, CVD, spin coating or sputtering, or by the phase-change printing technique. The substrate 100 can be made of glass, silicon, polymer, or a combination thereof or might even be a pre-patterned thin-film transistor array. The OLED further comprises a hole transport layer 106 and an electron transport/emitter layer 110' and a second electrode (cathode) 112 (metal).

Other OLED multi-layer devices may include further layers as depicted in FIG. 3b. Besides the hole transport layer 106 a hole injection layer 104 may be included. The combined electron transport/recombination layer could be separated into an electron transport layer 110 and an emission layer 108. All of those layers can be blends of several materials in particular the emission layer could be a blend of one or several host and dye materials. Thus, such multi-layer OLEDs can be formed on the suitable surface by consecutive casting of individual layers by the phase-change printing or spraying technique described with reference to the FIGS. 2a-c and FIG. 5.

A display can be formed as illustrated in FIG. 3c. Red 302, green 304, and blue 306 OLED pixels may be printed on a receptor substrate 300 by phase-change printing or spraying technique. Alternatively, the red, green and blue OLEDs could be printed on top of each other to create a multicolor stacked OLED device.

Figure 4:
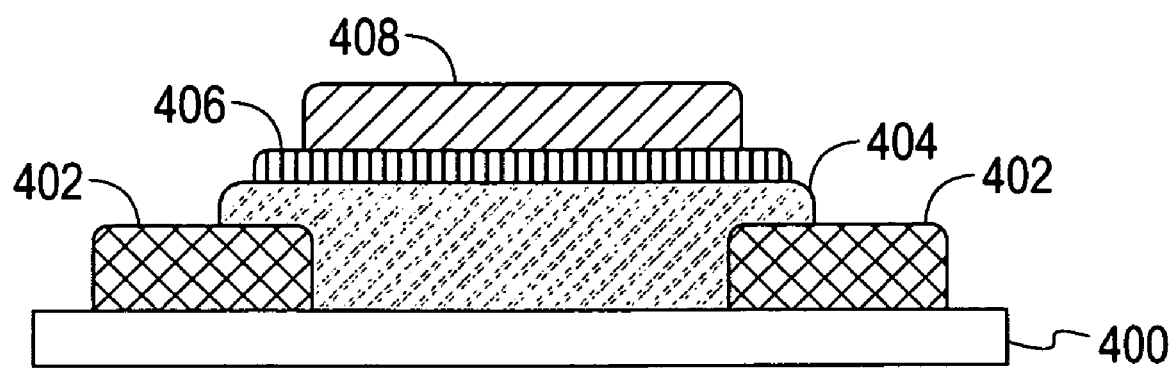
FIG. 4 shows a schematic illustration of a formation of a field-effect transistor.

One example of the formation of a field-effect transistor is illustrated in FIG. 4. Two electrical contacts named source and drain 402 are formed on the surface of an insulating substrate 400 that can comprise glass, silicon, polymer, or a combination thereof. The source and drain 402 can be formed by conventional techniques, e.g. PVD, CVD, sputtering, etc., but source and drain 402 can also be formed by phase-change printing or spraying. Further, an organic semiconducting layer 404 is applied by phase-change printing or spraying between source and drain contacts and overlapping these contacts 402. Pentacene or alpha-sexithiophene can here be used as organic molecules for the deposition material. An insulating layer 406 is then formed over the semiconducting layer 404, thereby the insulating layer 406 can comprise highly insulating materials such as tetrafluorethylen or vinylidenedifluoride derivatives. The polymers thereof are known as Teflon or PVDF (Teflon is a trademark of E.I. Du Pont de Nemours & Company). Finally, a third electrode 408, the gate electrode, is formed on top of the insulating layer 406. The third electrode 408 can be formed like the source and drain 402 and also may comprise nanoparticles of gold. The phase-change printing or spraying technique can be applied to all or several layers of the field-effect transistor. In fact, one printer with various containers each filled with the respective application or deposition materials can be used to produce a complete device, like the above-described OLED or thin-film transistor.

Figure 5:
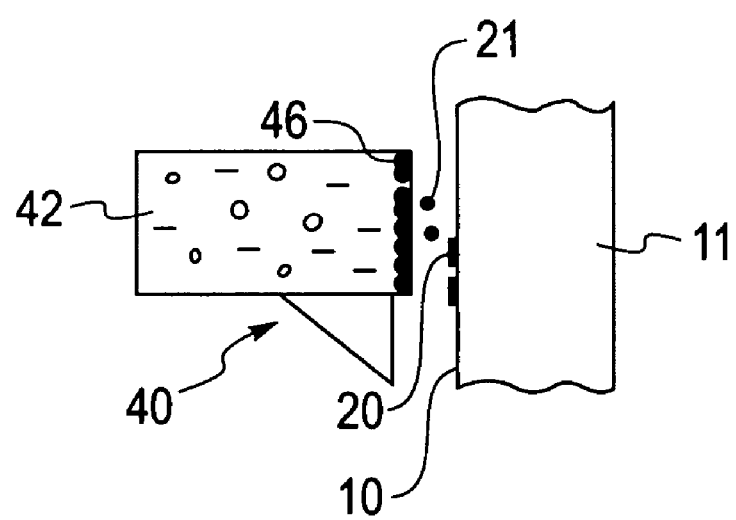
FIG. 5 illustrates a printing principle.

FIG. 5 illustrates the phase-change printing principle with its units. The simplified illustration shows a print-head 40 that comprises a pressure chamber 42 with the deposition material 20 filled in. Further, the print-head 40 comprises material jets 46 which work, for example, with piezo elements or nozzles (not shown in detail) to eject the melted deposition material 21. The print-head 40 can be brought close to the surface 10 of a device or substrate 11. For applying the deposition material 20 to the surface, either the print-head 40 is moved over the surface 10 or the print-head 40 is fixed and the substrate 11 with the surface 10 is moved in a way to pattern the surface 10 accordingly. In operation, via the material jets 46, the melted deposition material 21 is brought to the surface 10 where the melt 21 solidifies immediately and the solidified deposition material 20 remains. In a further embodiment, a material loader (not shown) containing the deposition material 20 is positioned close to the print-head 40 or even form together a single unit. In another embodiment, multiple of the material loader, each filled with a different deposition material 20, can be used to support the pressure chamber 42 and the print-head 40.

Any disclosed embodiment may be combined with one or several of the other embodiments shown and/or described. This is also possible for one or more features of the embodiments. Thus, the invention includes apparatus providing the steps of any process described above employing means known to those familiar with the art.

What is claimed is:

1. A fabrication process comprising fabricating a multiple layer electronic device having a pattern formed on a surface by a deposition material, the step of fabricating comprising the steps of:
    heating and applying a pressure to the deposition material to form a melt;
    depositing the melted deposition material on the surface with one of a phase-change printing technique and a spray technique,
    wherein the melted deposition material solidifies when it reaches the surface in a single phase transition from the melt to a solid, without any previously deposited layer being re-dissolved and intermixed by sequential deposition of multiple layers from different solutions.

2. The process according to claim 1, wherein in the step of heating and applying a pressure is performed in a pressure chamber.

3. The process according to claim 1, further comprising repeating the steps of heating and depositing to deposit multiple layers of the deposition material.

4. The process according to claim 3, wherein the multiple layers are formed by depositing different deposition materials.

5. The process according to claim 1, wherein the deposition material is selected to comprise one of an organic material; an OLED material; biological molecules; nanoparticles; and any combination of these materials.

6. The process according to claim 1, wherein the deposition material is selected to comprise a composition in form of a powder.

7. The process according to claim 1, wherein the deposition material is provided as a pellet.

8. The process according to claim 1, used to fabricate one of an organic light-emitting device; a monochrome and/or color display; a biological pattern; a biochip; a sensor; a semiconductor device; and a circuit.

9. A fabrication process comprising fabricating a multiple layer field-effect transistor, the step of fabricating comprising the steps of:
    forming source and drain contacts on a substrate;
    heating and applying a pressure to a deposition material to form a melt, the deposition material comprising an organic semiconducting material;
    depositing the melted deposition material onto the substrate with the source and drain contacts by one of a phase-change printing technique; and a spray technique, wherein the melted deposition material solidifies on the substrate and forms an organic semiconducting layer in a phase transition from the melt to a solid, without previously deposited layers being re-dissolved and intermixed by sequential deposition of multiple layers from different solutions;
    forming an insulating layer on the organic semiconducting layer; and
    forming a gate contact on the insulating layer.

10. A fabrication apparatus comprising means for fabricating a multiple layer electronic device having a pattern formed on a surface by a deposition material, the means for fabricating comprising:
    means for heating and applying a pressure to the deposition material to form a melt; and
    means for depositing the melted deposition material on the surface with one of: a phase-change printing technique and a spray technique,
    wherein the melted deposition material solidifies when it reaches the surface in a single phase transition from the melt to a solid, without any previously deposited layer being re-dissolved and intermixed by sequential deposition of multiple layers from different solutions.

11. The apparatus according to claim 10, wherein the means for heating and applying a pressure is performed in a pressure chamber.

12. A fabrication apparatus comprising means for fabricating a multiple layer field-effect transistor the means for fabricating comprising:

means for forming source and drain contacts on a substrate;

means for heating and applying a pressure to a deposition material to form a melt, the deposition material comprising an organic semiconducting material;

means for depositing the melted deposition material onto the substrate with the source and drain contacts by one of a phase-change printing technique, and a spray technique, wherein the melted deposition material solidifies on the substrate and forms an organic semiconducting layer, without any previously deposited layer being re-dissolved and intermixed by secjuential deposition of multiple layers from different solutions;

means for forming an insulating layer on the organic semiconducting layer; and means for forming a gate contact on the insulating layer.

13. The process according to claim 1, further comprising repeating the steps of heating and depositing in order to deposit multiple layers of the deposition material.

14. The process according to claim 9, wherein the step of heating and applying a pressure is performed in a pressure chamber.

15. The process according to claim 14, further comprising repeating the steps of heating and depositing to deposit multiple layers of the deposition material.

16. The process according to claim 15, wherein the multiple layers are formed by depositing different deposition materials.

17. The process according to claim 9, wherein the deposition material is selected to comprise one of: an organic material; an OLED material; biological molecules; nanoparticles; and any combination of these materials.

18. The process according to claim 9, wherein the deposition material is selected to comprise a composition in form of a powder.

19. The apparatus according to claim 10, wherein the device is one of an organic light-emitting device, a monochrome and/or color display, a biological pattern, a biochip, a sensor, a semiconductor device, and a circuit.

20. The apparatus according to claim 10, wherein multiple layers are formed by the means for depositing depositing different deposition materials.

* * * * *